United States Patent
Odedra (10) Patent No.: US 10,240,230 B2
(45) Date of Patent: Mar. 26, 2019

(54) PROCESS AND METHOD FOR IN-SITU DRY CLEANING OF THIN FILM DEPOSITION REACTORS AND THIN FILM LAYERS

(71) Applicant: SEASTAR CHEMICALS INC., Sidney (CA)

(72) Inventor: Rajesh Odedra, Sidney (CA)

(73) Assignee: SEASTAR CHEMICALS INC., Sidney, British Columbia (CA)

( * ) Notice: Subject to any disclaimer, the term of this patent is extended or adjusted under 35 U.S.C. 154(b) by 727 days.

(21) Appl. No.: 14/428,959

(22) PCT Filed: Dec. 18, 2012

(86) PCT No.: PCT/CA2012/001164
§ 371 (c)(1),
(2) Date: Mar. 17, 2015

(87) PCT Pub. No.: WO2014/094103
PCT Pub. Date: Jun. 26, 2014

(65) Prior Publication Data
US 2015/0218695 A1    Aug. 6, 2015

(51) Int. Cl.
*C23C 16/44* (2006.01)
*H01L 21/02* (2006.01)
(Continued)

(52) U.S. Cl.
CPC ........ *C23C 16/4405* (2013.01); *C23C 14/564* (2013.01); *C23G 5/00* (2013.01); *H01L 21/02046* (2013.01)

(58) Field of Classification Search
CPC ..... C23C 16/4405; C23C 14/564; C23G 5/00; H01L 21/02046
See application file for complete search history.

(56) References Cited

U.S. PATENT DOCUMENTS 5,326,431 A    7/1994   Kadomura
5,376,234 A  * 12/1994  Yanagida .......... H01L 21/31116
                                                                216/37
(Continued)

FOREIGN PATENT DOCUMENTS

JP    S50-071272      6/1975   ........... H01L 21/306
JP    62-280336 A    12/1987
(Continued)

OTHER PUBLICATIONS

Sugawara, Plasma Etching Fundamentals and Applications, 1998, Oxford University Press, Cover, ISBN page, 3.1.1 Etching rate and etching uniformity.*
(Continued)

*Primary Examiner* — Eric W Golightly
(74) *Attorney, Agent, or Firm* — Drinker Biddle & Reath LLP (57) ABSTRACT

The invention relates to the use of thionyl chloride and related materials for dry etching of internal surfaces of metalorganic vapor phase epitaxy (MOVPE) reactors to remove deposits. The method is also useful for the dry etching of process substrates within such reactors for cleaning and processing of those substrates. The invention may be particularly adaptable to chemical vapor deposition reactors used in the manufacture of high brightness LED's based on III-V semiconductors such as GaN and related materials. Features of the process include thermal, UV, and plasma activated dry cleaning, and the use of etchant gases such as $COCl_2$, $COBr_2$, $COI_2$, $SOI2$, $SOCl_2$, $SOBr_2$, $SO2Cl_2$, $SO_2Br_2$, NOCl, NOBr, NOI, $S_2Cl_2$, $S_2Br_2$, $SCI_2$, $SBr_2$, SOClBr, SOClF and SOFBr, either formed from neat materials or combinations of constituent gases such as CO, SO, $SO_2$ or NO with halogens, to achieve the desired effect.

14 Claims, 4 Drawing Sheets (51) Int. Cl.
*C23G 5/00* (2006.01)
*C23C 14/56* (2006.01)

(56) References Cited

U.S. PATENT DOCUMENTS

| | | | |
|---|---|---|---|
| 5,378,653 A | 1/1995 | Yanagida | |
| 5,445,712 A | 8/1995 | Yanagida | |
| 5,750,441 A * | 5/1998 | Figura | H01L 21/76804 257/E21.578 |
| 6,165,375 A * | 12/2000 | Yang | H01L 21/31116 216/67 |
| 6,559,462 B1 * | 5/2003 | Carpenter | H01J 37/3171 250/423 R |
| RE40,651 E * | 3/2009 | Huntington | A62D 1/0014 169/46 |
| 2002/0173164 A1 | 11/2002 | Raffin et al. | |
| 2004/0011380 A1 | 1/2004 | Ji et al. | 134/1.1 |
| 2004/0014327 A1 | 1/2004 | Ji et al. | 438/722 |
| 2004/0033310 A1 | 2/2004 | Sargiannis et al. | |
| 2004/0129671 A1 | 7/2004 | Ji et al. | |
| 2007/0006893 A1 | 1/2007 | Ji | |
| 2009/0130860 A1 | 5/2009 | Miya et al. | |
| 2010/0186774 A1 | 7/2010 | Miya et al. | 134/22.1 |
| 2011/0056515 A1 * | 3/2011 | Mitchell | C23C 16/4405 134/1.1 |

FOREIGN PATENT DOCUMENTS

| | | | |
|---|---|---|---|
| JP | H02-18926 | 1/1990 | H01L 21/205 |
| JP | H03-174725 | 7/1991 | H01L 21/304 |
| JP | H05-343362 A | 12/1993 | |
| JP | H06-005558 | 1/1994 | H01L 21/302 |
| JP | H06-013351 | 1/1994 | H01L 21/302 |
| JP | 2004-146787 | 5/2004 | H01L 21/31 |
| WO | WO 2009/037991 | 3/2009 | H01L 21/31 |
| WO | 2011117064 A1 | 9/2011 | |

OTHER PUBLICATIONS

Quirk et al, Semiconductor Manufacturing Technology, 2001, Prentice Hall, Cover, Fig.16.25.*
Air Products, Material Safety Data Sheet, Hydrogen Fluoride, Feb. 2000, Air Products, 1 page.*

* cited by examiner

PRIOR ART

Fig. 1

PRIOR ART

PROCESS AND METHOD FOR IN-SITU DRY CLEANING OF THIN FILM DEPOSITION REACTORS AND THIN FILM LAYERS

REFERENCE TO RELATED APPLICATIONS

This application is the US National Phase Entry of International Patent Application No. PCT/CA2012/001164 filed Sep. 18, 2012.

FIELD OF THE INVENTION

The invention relates to a method, composition and apparatus for dry etching or cleaning of interior surfaces of thin film deposition reactors.

BACKGROUND OF THE INVENTION

Metalorganic vapour phase epitaxy (MOVPE), also known as organometallic vapour phase epitaxy (OMVPE) or metalorganic chemical vapour deposition (MOCVD), is an arranged chemical vapour deposition method. In MOVPE ultra-pure gases are injected into a reactor and finely dosed to deposit a very thin layer of atoms onto a semiconductor wafer. Surface reaction of organic compounds or metalorganics and hydrides containing the required chemical elements creates conditions for crystalline growth—epitaxy of materials and compound semiconductors. Unlike traditional silicon semiconductors, these semiconductors may contain combinations of Group III and Group V, Group II and Group VI, Group IV, or Group IV, V and VI elements.

In the vapor phase epitaxy (VPE) technique, reactant gases are combined at elevated temperatures in the reactor to cause a chemical interaction, resulting in the deposition of materials on the substrate. In an atomic layer deposition (ALD) system, reactant gases are introduced sequentially to give self-limiting growth of conformal thin films of the desired materials. In both cases, the reactor is a chamber made of a material that does not react with the chemicals being used. It must also withstand high temperatures. This chamber comprises reactor walls, a liner, a susceptor, gas injection units, and temperature control units. Usually, the reactor walls are made from stainless steel or quartz. Ceramic or special glasses, such as quartz, are often used as the liner in the reactor chamber between the reactor wall and the susceptor. To prevent overheating, coolant, such as water, can flow through channels within the reactor walls. A substrate sits on a susceptor which is held at a controlled temperature. The susceptor is made from a material resistant to the metalorganic compounds used; graphite is sometimes used. For growing nitrides and related materials, a special coating on the graphite susceptor is necessary to prevent corrosion by ammonia ($NH_3$) gas.

One type of reactor used to carry out MOCVD is a cold-wall reactor. In a cold-wall reactor, the substrate is supported by a pedestal, which also acts as a susceptor. The pedestal/susceptor is the primary origin of heat energy in the reaction chamber. Only the susceptor is heated, so gases do not react until they reach the hot wafer surface. The pedestal/susceptor is made of a radiation-absorbing material such as carbon. In contrast, the walls of the reaction chamber in a cold-wall reactor are typically made of quartz which is largely transparent to electromagnetic radiation. The reaction chamber walls in a cold-wall reactor may be indirectly heated by heat radiating from the hot pedestal/susceptor, but will remain cooler than the pedestal/susceptor and the substrate supported on the pedestal/susceptor.

In some situations, such as hot-wall CVD, the entire chamber is heated. This may be necessary for certain gases, which must be pre-cracked before reaching the substrate surface to allow them to stick to the substrate.

Gas is introduced to the reactor chamber via devices known as bubblers. In a bubbler a carrier gas (usually nitrogen or hydrogen) is bubbled through the metalorganic liquid, allowing the gas to pick up some metalorganic vapour and transport it to the reactor in the gas phase. The amount of metalorganic vapour transported depends on the rate of carrier gas flow, the bubbler temperature and the vapour pressure of the metalorganic precursor.

When thin film deposition is carried out, not only is the film deposited on the desired surface but also on all the interior surfaces of the MOCVD or ALD reactor including the susceptor, the walls and the ceiling. The more frequently the reactor is used without being cleaned, the thicker the deposits become. The deposits will eventually start to delaminate, generating particles that can fall onto the substrate wafers, contaminating them and resulting in either low yield or complete loss of the wafers. The reactant gases flowing through the reactor chamber may also be contaminated by the deposits. In order to avoid this, reactors must be cleaned out on a regular basis. Depending on the configurations and materials used in the reactor, effective cleaning may require complete reactor strip down and wet clean, which is time consuming and reduces reactor efficiency. In addition, a reactor is typically comprised of a wide range of materials such as 316L and 304 stainless steel, silicon carbide, graphite, tungsten, aluminum, pyrolytic boron nitride and/or ethylene propylene diene (EPDN) polymer. It can be difficult to clean deposits off all of these types of surfaces, without using different types of etchants or other cleaners. A simpler, more effective means of cleaning inside a reactor is therefore desired.

Dry HCl gas, HF gas or other reactive gas, together with a purge gas, may be used to remove certain deposits by dry etching. Upon contact with the reactive gas, the metal components are converted into volatile halides and removed with the purge gas. Use of these highly reactive etchants is difficult as they are corrosive to components within the reactor vessel and require high temperatures.

U.S. Publication No. 2009130860 to Miya et al. discloses a thermal etching technique for removing high dielectric constant films, such as hafnium, zirconium or aluminum oxides, from a reactor chamber. A halide-based etchant gas, such as $BCl_3$, is supplied to the chamber, where the halide component is released, freeing the boron to preferentially bond with the oxygen from the deposited oxide film, breaking the chemical bonds within the deposited film. The reaction products may all then be purged from the reaction chamber. If a protective $B_xCl_y$ film forms over the film deposits, an oxygen-based component may be added to the etchant gas, which accelerates the etching reaction. Changing the temperature and pressure at which the etching reaction is carried out can also influence the etching rate. The etching procedure can take several cycles to satisfactorily remove the deposited film.

It is also known to clean MOCVD reactors using organic based materials. International Publication No. WO2011/117064 A1 to Hess et al. illustrates a method for deposition of multicomponent semiconductor layers, in particular III-V materials, onto a substrate located on a susceptor in a process chamber. Pyrolitic decomposition of one or more process gasses within the process chamber produces a deposition layer on the substrate and unwanted adherences to the surfaces of the process chamber. After or prior to deposition, the adherences are removed by introducing a purge gas containing a reactive substance comprising free radicals, preferably alkyl radicals or other hydrocarbon compounds, into the process chamber.

U.S. Publication No. 2004/0033310 to Sarigiannis et al. discloses a deposition method for depositing layers on a substrate while minimizing deposition on the internal walls of the reactor chamber. A process gas is introduced into a process chamber, where a substrate is carried by a heated susceptor. The process gas decomposes pyrolitically inside the heated process chamber. A layer is formed on the substrate and some material adheres to the process chamber surface. A reactive purge gas is provided to the deposition chamber, effectively forming a reactive gas curtain over the surfaces of the chamber walls, but away from the substrate. The adhering material reacts with the purge gas to form a volatile product which is then removed from the process chamber.

Alternatively, the components of the reactor vessel may be cleaned by wet etching, which involves dismantling of the vessel and then cleaning the components in suitable reagents. Wet etching is disadvantageous in that it is time and labour consuming in comparison with dry reactive gas etching.

Dry etching processes have been used in order to maximize deposition of preferred layer materials, and/or to better control the location of the deposition. For example, U.S. Pat. No. 5,326,431 to Kadomura discloses a dry etching method for Si or Al based substrate materials masked by a nitrogen based compound film such as TiON, $Si_3N_4$ or TiN, using an ionized etchant gas comprising a sulfur containing compound including $SOF_2$, $SOCl_2$, and $SOBr_2$. The presence of sulfur compounds generates free sulfur which forms a protective layer on the masking layer, improving the anisotropy of the etching. The efficacy of the process may be improved by adding a halogen and/or a nitrogen based compound to the etchant gas.

U.S. Pat. No. 5,445,712 to Yanagida discloses a dry etching method for $SiO_2$ based materials using an ionized etchant gas containing a fluorocarbon compound and an oxyhalogen compound such as carbonyl, thionyl, sulfuryl, nitrosyl, or nitryl halides. The oxyhalogen has the effect of extracting oxygen from $SiO_2$, thereby increasing the etching of the silicon by the ionized fluorocarbon.

U.S. Pat. No. 5,378,653, also to Yanagida, describes a dry etching process for an Al-based metallization layer using an etchant gas having a halogen compound with a functional group, such as thionyl or sulfuryl, and a halogen atom. The etchant gas may also include a sulfur-based compound.

JP62280336 to Shoji discloses a method of recovering ruthenium from a base material of metallic oxides such as $TiO_2$, $Co_2O_3$, $Al_2O_3$, $SiO_2$, by crushing the mixture and heating it in the presence of carbon and a chloride gas such as $COCl_2$, $CCl_4$, or $SOCl_2$. The base metal oxides form gaseous chlorides, which are removed by evaporation, while chlorides of Ru are dissociated by the high temperature allowing for the recovery of Ru metal from the residue by gravity separation.

These references generally detail a combination of multiple etchant mixtures and plasma to achieve the etching. Also the details in these references are quite specific, being directed to specific substrates and deposition materials.

It is therefore an object of the invention to provide a method of cleaning a reactor chamber that overcomes or minimizes the foregoing difficulties.

It is a further object of the invention to provide a low temperature, efficient method of cleaning a process chamber.

It is yet a further object of the invention to provide a method of cleaning a substrate prior to the deposition process.

A further object of the invention is to provide a method of etching masked layers on a substrate.

These and other objects of the invention will be appreciated by reference to the summary of the invention and to the detailed description of the preferred embodiment that follow.

SUMMARY OF THE INVENTION

This invention provides a method and material to dry etch unwanted deposits from the internal reactor chamber in order to simply and effectively remove the deposits without the need for substantial reactor downtime or disassembly. In particular, the invention relates to the use of thionyl chloride ($SOCl_2$) and related materials for the dry etching (or dry cleaning) of MOCVD and ALD reactors to remove deposits that build up over time. It may be especially suited for MOCVD reactors used in the manufacture of high brightness LED's and other devices based on III-V semiconductors including elements comprising one or more of indium, gallium, and aluminum (In, Ga, Al), combined with one or more of arsenic, nitrogen, and phosphorus.

The features of the invention include thermal dry cleaning, UV activated dry cleaning, and the use of thionyl chloride or related non-metal halides ($SOCl_2$, $SOBr_2$, $COCl_2$, NOCl, NOBr, SOCl, SOBr neat materials or combinations of gases such as CO and $Cl_2$, NO and $Br_2$) to achieve the desired effect. Active halogens such as $Cl_2$ or $Br_2$ may be added to the gaseous mixture to improve the etching/cleaning effectiveness and/or efficiency.

An advantage of the invention is the simple use of pure compounds or gas mixtures to generate the cleaning compounds in-situ. The new process relies on thermal or light activation to achieve efficient dry etching.

In one aspect, the invention comprises a method for cleaning reaction product deposits from interior surfaces of a chemical reactor chamber or from a substrate within the chemical reactor chamber, comprising the steps of heating the reactor chamber to an elevated temperature; introducing an etchant gas into the reactor chamber, activating the etchant gas; allowing an etching reaction to proceed between the etchant gas and the reaction product deposits; and evacuating the etchant gas together with gaseous products of the etching reaction.

The etchant gas may be of the general formula $AO_mX_n$, wherein A is selected from the group consisting of C, N, and S; O is oxygen; X is a halogen; and the subscripts m and n are greater than zero. Alternatively, the etchant gas may be of the general formula $AO_mX_nY_p$, wherein A is selected from the group consisting of C, N, and S; O is oxygen; X and Y are different halogens; and the subscripts m, n and p are greater than zero. As another alternative, the etchant gas may be of the general formula $A_mX_n$, wherein A is selected from the group consisting of C, N, and S; X is a halogen; and the subscripts m and n are greater than zero.

In another aspect, the invention comprises the further step of generating the etchant gas prior to the introduction into the chamber. This generation may take the form of bubbling a carrier gas through a plurality of liquid chemical constituents and then combining the resulting gases, and/or mixing two or more chemical constituent gases. Alternatively or in addition, the carrier gas may be bubbled through a liquid chemical constituent to volatilize the liquid chemical constituent into the etchant, prior to the introduction of the etchant gas into the chamber.

In yet a further aspect, the invention may comprise activating the etchant gas by exposing it to an activation mechanism in a gas activation chamber prior to introduction into the reactor chamber. The gas activation mechanism may be any one or more of heat, ultraviolet light and plasma discharge. Alternatively, the etchant gas may be activated by exposing it to a thermal activation mechanism after introduction into the reactor chamber; the thermal activation mechanism being selected from the group consisting of the overall temperature within the reactor chamber and a local heat source within the reactor chamber.

In yet a further aspect, the etchant gas may also contain an additive. The additive may be a halogen gas, or it may be of the general formula RX, wherein R is selected from the group consisting of H and Me; and X is a halogen, selected from the group consisting of F, Cl, Br and I.

The foregoing was intended as a broad summary only and of only some of the aspects of the invention. It was not intended to define the limits or requirements of the invention. Other aspects of the invention will be appreciated by reference to the detailed description of the preferred embodiment and to the claims.

BRIEF DESCRIPTION OF THE DRAWINGS

The preferred embodiment of the invention will be described by reference to the drawings in which.

DETAILED DESCRIPTION OF THE INVENTION

Figure 1:
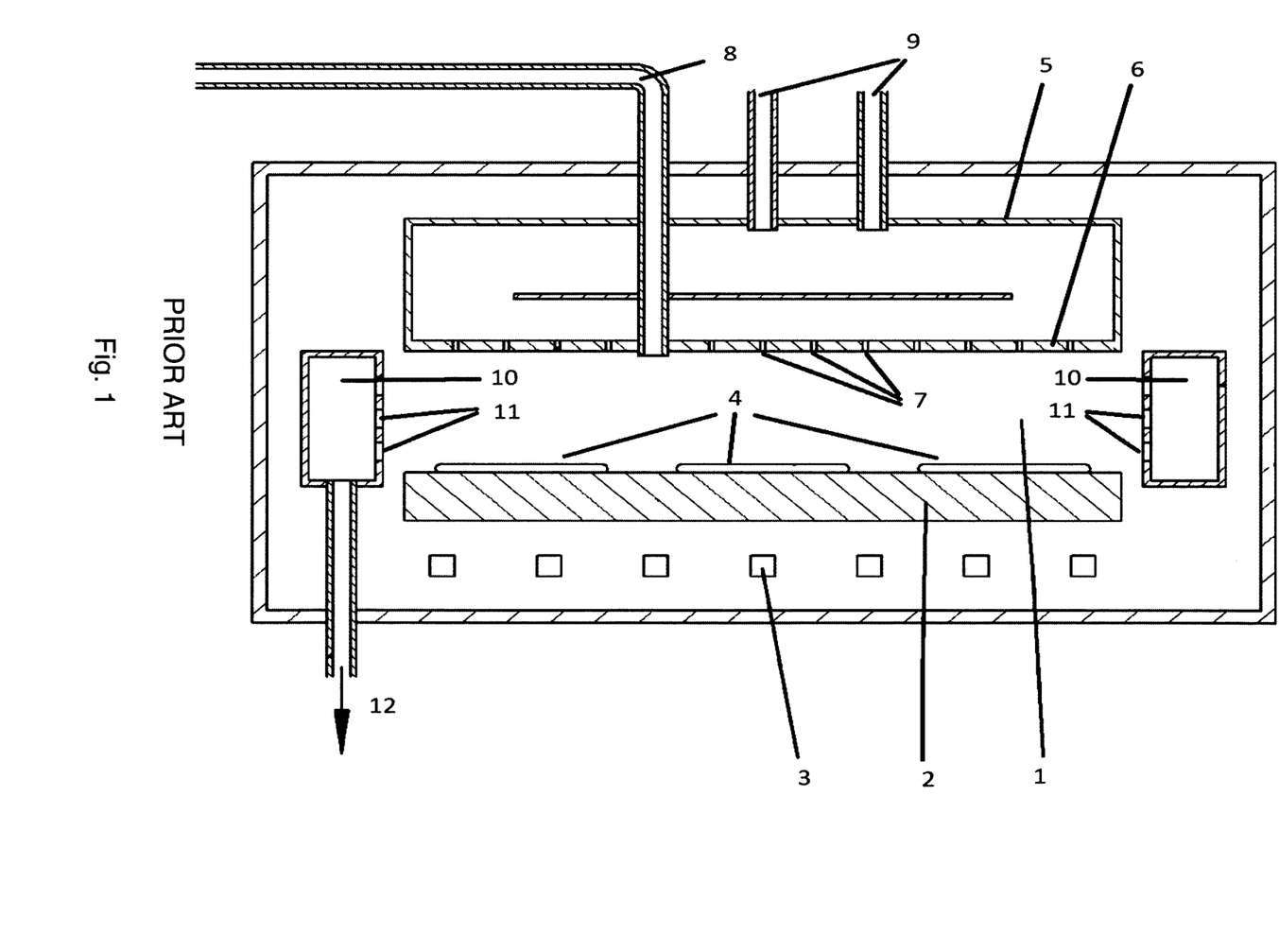
FIG. 1 is a diagrammatical sectional view of a typical MOCVD reactor.

Referring to FIG. 1, a typical reactor comprises a reactor chamber 1, in which a susceptor plate 2 is capable of supporting one or more substrates 4. One or more heating elements 3 may be used to control the temperature of the susceptor 2, holding it as necessary in the proper range for effective thin film deposition. Reactive process gas enters the chamber 1 through one or more feed lines 9, and is distributed through the chamber 1 via a dispersal means such as showerhead 5, which comprises a lower plate 6 having a plurality of orifices 7 to spread the gas feed evenly throughout the chamber 1. After a deposition cycle has taken place, the chamber may be purged by feeding purge gas through a feed line 8. The chamber is evacuated by removing gas through gas outlet ring 10, comprising one or more orifices 11, into a gas evacuation line 12, which may be connected to a vacuum pump and gas disposal means or recycling means, depending on the system.

In use, the dry etching process consists of heating the entire reactor chamber 1 to an elevated temperature, typically in the range between 100° C. and 400° C., and providing an etchant gas, which is introduced into reactor chamber 1 via one or more process gas feed lines 9. The gas may be introduced through a gas distribution mechanism, such as shower head 5 or via gas feed line 8. The etchant gas flows through the reactor chamber 1, before being evacuated together with any produced reaction products through gas evacuation ring 10 and pumped out through gas evacuation line 12. The gas pressure in the reactor chamber 1 is typically maintained at between 20 mBar and 1000 mBar (atmospheric pressure) during the dry etching cycle.

Figure 2:
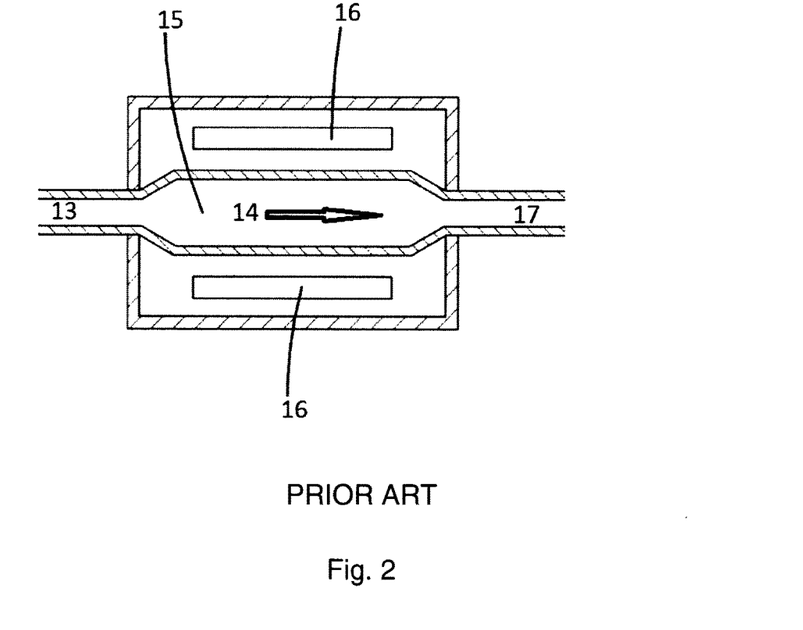
FIG. 2 is a gas activation chamber used to activate etchant gas flowing through chamber by exposure to heat, UV light, or plasma discharge.

The etchant gas is preferably activated to enhance the generation of free radicals, and thereby to enhance the etching process. This may be achieved by thermal activation, ultraviolet (UV) excitation, or plasma discharge, as shown in FIG. 2. The etchant gas 14 enters the activation chamber through inlet 13. Within the activation chamber, a volume of gas 15 is exposed to an activation energy source 16, such as a heater (thermal activation), a UV lamp (UV activation) or an ionizing RF field (plasma activation). Thermal activation may be effected by heating of the MOVPE reactor vessel, or the etchant gas may be pre-heated in a heating chamber prior to injection into the reactor vessel. In the case of UV or plasma discharge activation the etchant gas is activated in an activation chamber by exposure to UV light or radio frequency plasma discharge prior to injection into the reactor vessel. The activated gas exits the activation chamber through outlet 17, and passes into the MOCVD reactor chamber 1 (not shown).

The etchant gas comprises a carbonyl, thionyl, or nitrosyl group (CO, SO, or NO) combined with a halogen: chlorine, bromine, or iodine (Cl, Br, or I). $COCl_2$, $COBr_2$, $COI_2$, $SOI_2$, $SOCl_2$, $SOBr_2$, $SO_2Cl_2$, $SO_2Br_2$, NOCl, NOBr, NOI, $S_2Cl_2$, $S_2Br_2$, $SCl_2$, $SBr_2$, SOClBr, SOClF and SOFBr are examples of suitable etchant gases. The etchant gas may be derived from the neat material, or may alternatively be generated by a combination of separate components, such as CO, SO, $SO_2$, or NO mixed with $Cl_2$, $Br_2$, or $I_2$. The etchant gas may be mixed with a carrier gas such as argon, nitrogen, or hydrogen. The etchant gas or its components may be supplied directly from one or more gas cylinders, in the case of etchant constituents that are available in the gaseous state. In the case of etchant gas constituents that are normally in a liquid state, the required gaseous state is preferably achieved by bubbling the carrier gas through a container with the liquid etchant component, volatilizing the liquid constituents into the etchant, thereby producing a mixture of carrier gas and etchant vapour. Alternatively, the liquid chemical constituents may be heated until they vaporize, at which point the vapor is combined with a carrier gas, if necessary, and introduced into the reactor chamber 1. The etchant gas may contain additional amounts of halogen to enhance etching. The etchant gas may contain additional amounts of methyl halide, hydrogen halide or other halogen compounds to enhance etching.

Within the reaction chamber the etchant gas reacts with metal containing deposits to form volatile metal halides which are removed with the purging of the etchant gas. A typical reaction involves the reaction of the metallic oxide with the purge gas to form metallic halide with the residual oxygen combining with the carbonyl/thionyl/nitrosyl group. For example:

$$Ga_2O_3 + 3SOBr_2 \rightarrow 2GaBr_3 + 3SO_2$$

$$2Ga_2O_3 + 6SOBrCl \rightarrow GaClBr_2 + GaBrCl_2 + GaCl_3 + GaBr_3 + 6SO_2$$

$$Ga_2O_3 + 3NOBr \rightarrow GaBr_3 + 3NO_2$$

$$In_2O_3 + 3COCl_2 \rightarrow 2InCl_3 + 3CO_2$$

Other metal containing deposits also react to form metal halides; the oxide is given as an example of the most difficult deposit to remove due to the strong affinity of the metal for oxygen.

Once the metallic halide is formed, it must be removed from the reaction chamber. One way to do so is to reduce the pressure in the chamber to mobilize the halides for removal from the reactor chamber. Another option, which may be used alone or in combination with a reduced chamber pressure, is to heat the chamber to a temperature sufficient to evaporate or sublimate the halide. Table 1 lists some typical reaction products and their boiling points.

TABLE 1

Reaction products and their boiling point temperatures.

| Material | B.P (° C.) | Material | B.P (° C.) |
|---|---|---|---|
| $GaCl_3$ | 201 | $AlBr_3$ | 263 |
| $GaBr_3$ | 279 | $AlI_3$ | 191 |
| $GaI_3$ | 345 (sub) | $NCl_3$ | <71 |
| $InCl_3$ | 600 | $NBr_3$ | Explodes upon melting |
| $InBr_3$ | >600 | $NI_3$ | Explodes |
| $InI_3$ | 210 | $NH_3$ | −33 |
| $AlCl_3$ | 183 | $Me_3N$ | 3 |

Experimental Results

Figure 3:
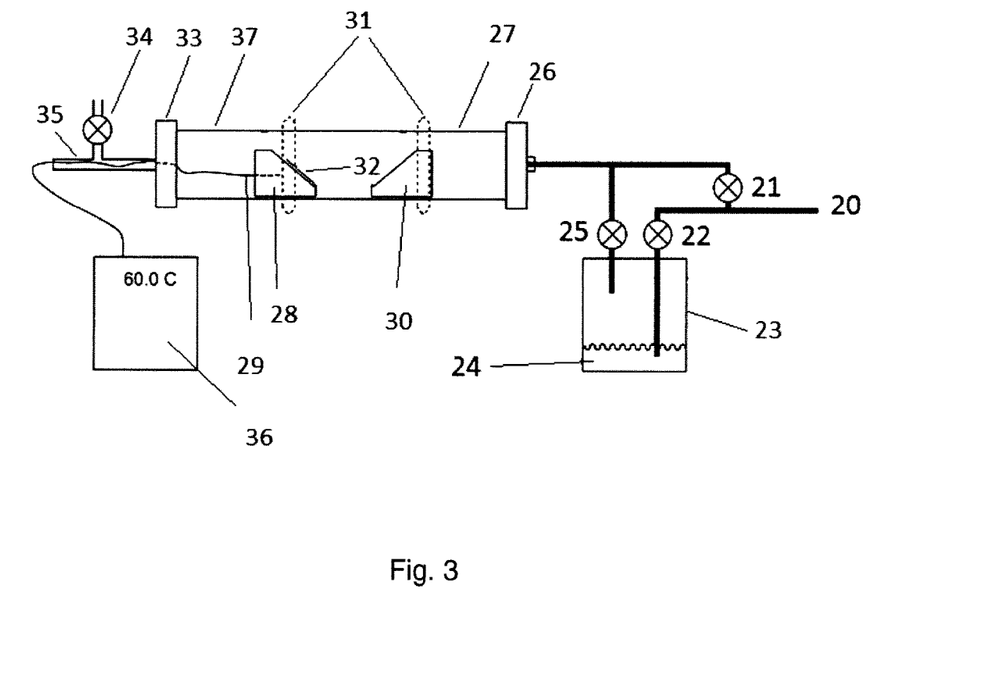
FIG. 3 is an experimental apparatus used to demonstrate thermally activated dry etching on substrates coated with materials typical of deposits in MOVPE reactors.

Referring generally to FIG. 3, a first embodiment of the dry etching process of the invention is carried out in an experimental reaction chamber 27 arranged as follows. The reaction chamber 27, being a quartz tube having an input end flange 26 and an output end flange 33, contains a first substrate holder 28, which is able to support a test substrate 32. A second substrate holder 30 is also provided, but for the purposes of the experiment does not hold a substrate. Each substrate is heated by a suitable heater 31, which may be for example, an infrared heater. A pre-heating zone is created around substrate holder 30, wherein the etchant gas flow is pre-heated before it reaches the test substrate 32 on substrate holder 28. The temperature of the substrate holder 28 may be monitored as needed, such as by thermocouple wires 29 which pass through 35 an end of the reactor chamber, and produce a readout on recorder 36. The temperature within the reactor chamber is preferably controlled such that a cooled section 37 is maintained near the output end flange 33. An output valve 34 connected to a vacuum pump (not shown) regulates the pressure within the reactor chamber.

Gas input line 20 feeds a carrier gas, such as argon, nitrogen, or hydrogen, into the system. The carrier gas feed may pass through direct input valve 21 directly into the reaction chamber, as may be required during a purge cycle, or it may pass through bubbler valve 22. The carrier gas entering the bubbler 23 passes through liquid reagent etching component 24, where it picks up etchant vapour and transports it to the reactor in the gas phase, controlled by valve 25. Once operational temperature of the substrate holders is reached, the flow of carrier gas is directed through the reagent 24 by closing valve 21 and opening valves 22 and 25. The resultant etchant gas flows across test substrate 32 and dry etches the reactor deposits on the substrate 32. Volatile non-gaseous reaction products are condensed onto the cooled section 37 of chamber 27.

For the purpose of these experiments, test substrate 32 comprises stainless steel, a material typical of MOVPE reactor structural material. The substrates each bore a typical MOPVE reactor deposit resulting from III-V fabrication processes, namely a coating formed during the deposition of GaN using trimethyl gallium $Ga(CH_3)_3$ and ammonia $NH_3$ at high temperatures (>700° C.) using MOCVD.

Example 1—$SOCl_2$ 200° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. Once the substrate reached a temperature of 200° C., the flow of the carrier gas was diverted through bubbler valve 22 into bubbler 23 containing reagent 24 ($SOCl_2$), such that $SOCl_2$ was picked up in the carrier gas, forming an etchant gas. The etchant gas entered the reactor chamber 27 through valve 25, passed over the substrate 32 and etched away the deposit on the stainless steel substrate 32. The reaction was very rapid over the first five minutes, and then proceeded more slowly, such that the etching process took 10-13 minutes to clean the substrate to a shiny stainless condition. The by-products, which were mainly $GaCl_3$ and $SO_2$, were collected in the cooled area 37 of chamber 27.

Example 2—$SOBr_2$ 200° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. Once the substrate reached 200° C., the flow of the carrier gas was diverted through bubbler valve 22 into bubbler 23 containing reagent 24 ($SOBr_2$), such that $SOBr_2$ was picked up in the carrier gas, producing an etchant gas. The etchant gas entered the reactor chamber 27 through valve 25, passed over the substrate 32 and etched away the deposit on the stainless steel substrate 32. The reaction was very quick and efficient, cleaning the substrate completely within 7-9 minutes. The by-products, which were mainly $GaBr_3$ and $SO_2$, were collected in the cooled area 37 of chamber 27.

Example 3—$SOBr_2$ 200° Preheat 300° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. The second substrate holder 30 was heated to 300° C. with the IR heater 31. Once the appropriate temperatures were reached, the flow of the carrier gas was diverted through bubbler valve 22 into bubbler 23 containing reagent 24 ($SOBr_2$), such that $SOBr_2$ was picked up in the carrier gas, and an etchant gas was produced. The etchant gas entered the reactor chamber 27 through valve 25, was thermally activated as it passed over the substrate holder 30, passed over substrate 32 and etched away the deposit on the stainless steel substrate 32. The reaction was very quick and efficient, cleaning the substrate completely within 3-5 minutes. The by-products, which were mainly $GaBr_3$ and $SO_2$, were collected in the cooled area 37 of chamber 27.

Example 4—SOClBr 200° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. Once the substrate reached 200° C., the flow of the carrier gas was diverted through bubbler valve 22 into bubbler 23 containing reagent 24 (SOClBr), such that SOClBr was picked up in the carrier gas, producing an etchant gas. The etchant gas entered the reactor chamber 27 through valve 25, passed over the substrate 32 and etched away the deposit on the stainless steel substrate 32. The reaction was quick and efficient, cleaning the substrate completely within 3-5 minutes. The by-products, which were mainly $GaClBr_2$, $GaBrCl_2$, $GaBr_3$, $GaCl_3$ and $SO_2$, were collected in the cooled area 37 of chamber 27.

Example 5—$SOBr_2$ with 5% $Br_2$ at 250° C.

A coated substrate 32 was placed on the first substrate holder 28. The substrate 32 was heated with IR heater 31 to 250° C. under a continuous carrier gas (Ar) flow through the reactor chamber 27 from the gas inlet 20 and direct input valve 21. The second substrate holder 30 was heated to 300° C. with the IR heater 31. Once the appropriate temperatures were reached, the flow of the carrier gas was diverted through bubbler valve 22 into bubbler 23 containing reagent 24 ($SOBr_2$ and 5% $Br_2$ by volume), such that $SOBr_2/Br_2$ was picked up in the carrier gas, and an etchant gas was produced. The etchant gas entered the reactor chamber 27 through valve 25, was thermally activated as it passed over the substrate holder 30, passed over substrate 32 and etched away the deposit on the stainless steel substrate 32. The reaction was very quick and efficient, cleaning the substrate completely within 5-6 minutes. The by-products, which were mainly $GaBr_3$ and $SO_2$, were collected in the cooled area 37 of chamber 27.

Figure 4:
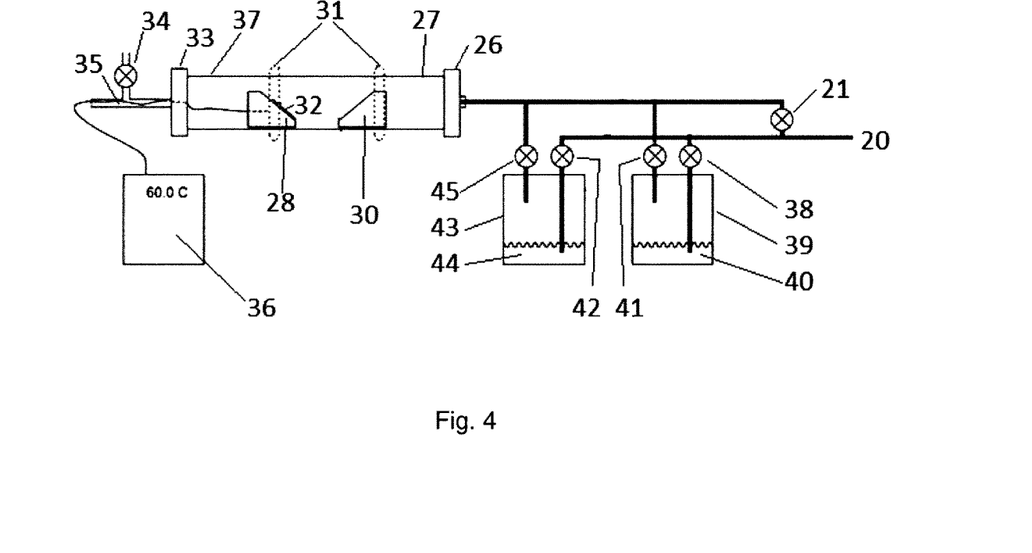
FIG. 4 is an experimental apparatus used to demonstrate thermally activated dry etching with multiple etchant components on substrates coated with materials typical of deposits in MOVPE reactors.

Referring now to FIG. 4, an experimental apparatus for carrying out a second embodiment of the invention comprises a similar arrangement of reaction chamber 27 bounded by an input end flange 26 and an output end flange 33. First and second substrate holders 28, 30 are provided, each heated by a heater 31, which may, for example be an infrared heater or any suitable heater. As in the first arrangement, only substrate holder 28 supports a test substrate 32, while second substrate holder 30 is used to create a preheating zone wherein the etchant gas flow is heated before it reaches the test substrate. Recorder 36 and thermocouple wires 29 monitor the substrate temperature as needed. A cooled section 37 is maintained near the output end flange 33. An output valve 34 connected to a vacuum pump (not shown) regulates the pressure within the reactor chamber.

In this embodiment, the input gas is treated differently before it enters the reaction chamber 27. As before, the carrier gas feed may pass through direct input valve 21 directly into the reaction chamber, as may be required during a purge cycle, but this embodiment contains two bubbler valves, 38, 42, each accessing a separate bubbler 39, 43, which contains a different liquid reagent etching component, 40, 44. The carrier gas entering the bubblers 39, 43 can thus pick up traces of two different etchant vapours, and transport them to the reactor in the gas phase, controlled by valves 41, 45. Once operational temperature of the substrate holders is reached, the flow of carrier gas is directed through the reagents 40, 44 by closing valve 21 and opening valves 38 and 41 for the first reagent, and valves 42 and 45 for the second reagent, creating two different etchant gases. The two etchant gases mix before entering the reactor chamber 27 and the flow of the mixed etchant gas dry etches the reactor deposits on test substrate 32. Volatile non-gaseous reaction products are condensed onto the cooled section 37 of chamber 27.

Example 6—$SOBr_2+Br_2$ 200° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. Once the appropriate temperature was reached, the flow of the gas was diverted through bubbler valve 38 into bubbler 39 containing reagent 40 ($SOBr_2$), and through bubbler valve 42 into bubbler 43 containing reagent 44 ($Br_2$) such that $SOBr_2$ and $Br_2$ were picked up in the carrier gas flows. The gases containing $SOBr_2$ and $Br_2$ exited through valves 41 and 45 respectively and combined to form an etchant gas before entering the reactor chamber 27. The etchant gas passed over substrate 32 and etched away the deposit on the stainless steel substrate 32. Although the etching process removed most of the coating from the substrate, a persistent film of greyish orange streaks remained on the substrate after 15 minutes of etching. The by-products, which were mainly $GaBr_3$ and $SO_2$, were collected in the cooled area 37 of chamber 27.

Example 7—$SOBr_2+MeBr$ 200° C.

A coated substrate 32 was placed on the first substrate holder 28. The substrate 32 was heated with IR heater 31 to 200° C. under a continuous carrier gas (Ar) flow through the reactor chamber 27 from the gas inlet 20 and direct input valve 21. Once the appropriate temperature was reached, the flow of the gas was diverted through bubbler valve 38 into bubbler 39 containing reagent 40 ($SOBr_2$), and through bubbler valve 42 into bubbler 43 containing reagent 44 (MeBr) such that $SOBr_2$ and MeBr (about 4-6% as compared to $SOBr_2$) were picked up in the carrier gas flows. The gases containing $SOBr_2$ and MeBr exited through valves 41 and 45 respectively and combined to form an etchant gas before entering the reactor chamber 27. The etchant gas passed over substrate 32 and etched away the deposit on the stainless steel substrate 32 completely in approximately 6 minutes. The by-products, which were mainly $GaBr_3$, $MeGaBr_2$, $Me_2GaBr$ and $SO_2$, were collected in the cooled area 37 of chamber 27.

Figure 5:
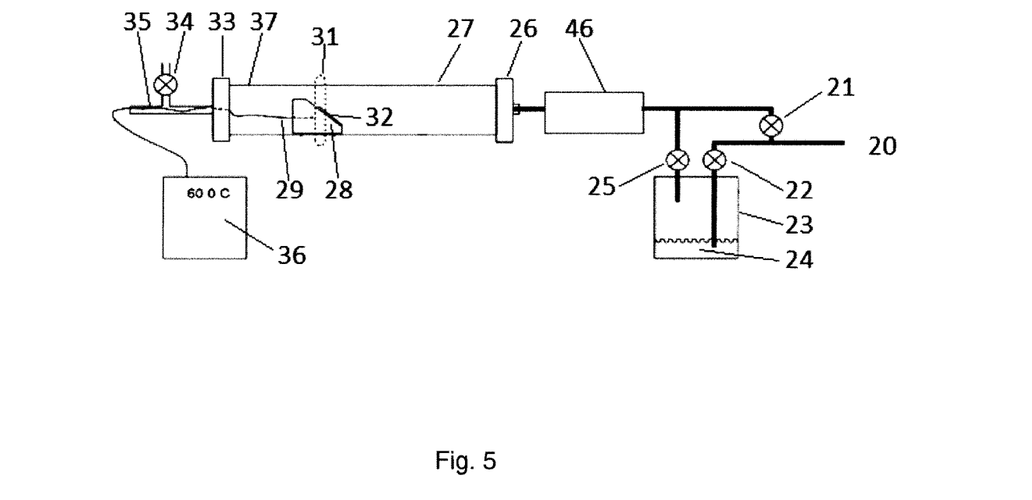
FIG. 5 is an experimental apparatus used to demonstrate UV light activated dry etching on substrates coated with materials typical of deposits in MOVPE reactors.

Referring now to FIG. 5, an experimental apparatus for carrying out a third embodiment of the invention comprises a similar arrangement of reaction chamber 27 bounded by an input end flange 26 and an output end flange 33. Only one substrate holder 28 is provided, heated by suitable heater 31, and supporting a test substrate 32. Recorder 36 and thermocouple wires 29 monitor the substrate temperature as needed. A cooled section 37 is maintained near the output end flange 33. An output valve 34 connected to a vacuum pump (not shown) regulates the pressure within the reactor chamber 27.

In this apparatus, the input gas is treated in the same manner as in the first embodiment before it enters the reaction chamber 27. Gas input line 20 feeds a carrier gas into the system. The carrier gas feed may pass through direct input valve 21 directly into the reaction chamber or through bubbler valve 22. The carrier gas entering the bubbler 23 passes through liquid reagent etching component 24, where it picks up etchant vapour and transports it to the reactor in the gas phase, controlled by valve 25. Once operational temperature of the substrate holders is reached, the flow of carrier gas is directed through the reagent 24 by closing valve 21 and opening valves 22 and 25, producing an etchant gas. The etchant gas is then passed through an activation chamber, in this case a UV activation chamber 46, in which the gas flow is irradiated to activate the etchant gas. The activated gas flows across the test substrate 32 and dry etches the reactor deposits on the substrate 32. Volatile non-gaseous reaction products are condensed onto the cooled section 37 of chamber 27.

Example 8—$SOCl_2$ 150° C.—UV Pre-Excitation

A coated substrate 32 was placed on the first substrate holder 28. The substrate 32 was heated with IR heater 31 to 150° C. under a continuous carrier gas (Ar) flow through the reactor chamber 27 from the gas inlet 20 and direct input valve 21. Once the substrate reached 150° C., the flow of the gas was diverted through bubbler valve 22 into bubbler 23 containing reagent 24 ($SOCl_2$), such that $SOCl_2$ was picked up in the gas. The $SOCl_2$ exited the bubbler through valve 25, passed through activation chamber 46, then entered the reaction chamber 27, where it passed over the substrate 32 and etched away the deposit on the stainless steel substrate 32. The reaction was very quick and efficient, cleaning the substrate completely within 3-5 minutes. The by-products, which were mainly $GaCl_3$ and $SO_2$, were collected in the cooled area 37 of the chamber 27.

Figure 6:
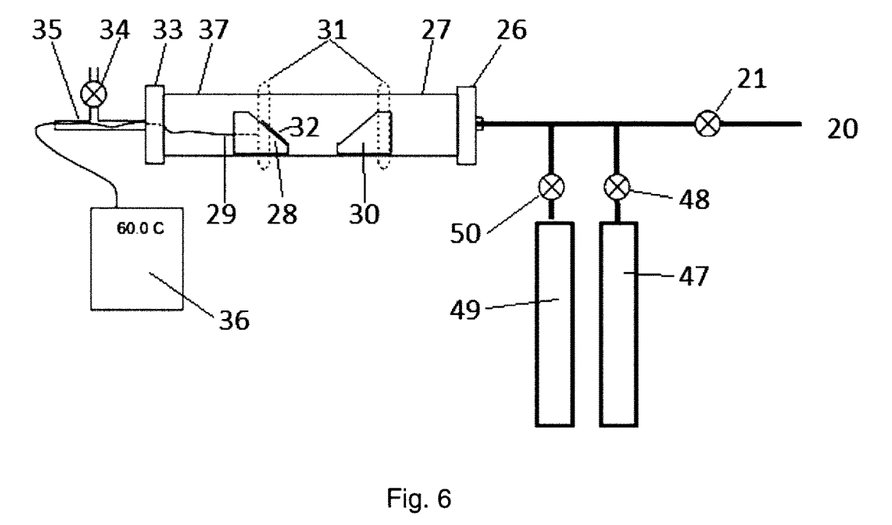
FIG. 6 is an experimental apparatus used to demonstrate thermally activated dry etching using a mixture of reagent gasses according to the present invention.

FIG. 6 shows an experimental apparatus for carrying out a fourth embodiment of the invention. The reactor chamber 27 and its contents are all the same as the first embodiment, but in this case the etchant gas is supplied directly from one or more cylinders 47, 49 of compressed gas, regulated by valves 48, 50. Gas input line 20 feeds a carrier gas, such as argon, into the system. The carrier gas feed may pass through direct input valve 21 directly into the reaction chamber, as may be required during a purge cycle. Once operational temperature of the substrate holders is reached, the flow of carrier gas is stopped by closing valve 21 and the flow of etchant gas components from compressed gas cylinders 47 and 49 is initiated by opening valves 48 and 50. The gases combine before entering the reaction chamber 27, and the resultant combined etchant flows across test substrate 32 to dry etch the reactor deposits on test substrate 32. Volatile non-gaseous reaction products are condensed onto the cooled section 37 of the chamber 27.

Example 9—No Carrier Gas, $CO+Br_2$ 200° C.; Preheat to 300° C.

A coated substrate 32 was placed on the first substrate holder 28. The substrate 32 was heated with IR heater 31 to 200° C. under a continuous gas (Ar) flow through the reactor chamber 27 from the gas inlet 20 and direct input valve 21. The second substrate holder 30 was heated to 300° C. with the IR heater 31. Once the appropriate temperatures were reached, the flow of the carrier gas was stopped by closing valve 21, while valves 48 and 50 were opened sequentially, allowing the etchant gases ($Br_2$ and CO; about 5% $Br_2$ compared to CO) to combine and enter the reactor chamber 27. The etchant gas combination was thermally activated as it passed through the heated area over the substrate holder 30. When the activated gas passed over substrate 32, it etched away a substantial part of the coating on the substrate 32, though a very faint film remained on the surface. The by-products, which were mainly $GaBr_3$ and $CO_2$, were collected in the cooled area 37 of the chamber 27.

Most of these experiments were conducted using the $SOX_2$ system, as the thionyl halide, being a liquid at room temperature, is simpler to handle. It was also shown to be effective. Because the chemistry (i.e. the reactivity) of other similar systems such as carbonyl ($COX_2$) and nitrosyl (NOX) is very similar, it is anticipated that those chemicals will also work for the applications outlined herein. In all cases, the process for the etching of the metal oxides is driven by generation of $SO_2$, $CO_2$ and $NO_2$ gases from the etchant gas, as those gases are more stable than the starting material and also very volatile. The formation of metal halides $GaCl_3$, $GaBr_3$, which are again stable yet volatile at the process temperature, also drives the reaction.

Further, each of the materials can normally be prepared by reaction of the individual gases. For example, NO and $Cl_2$ will react in the gas phase to generate NOCl. It is therefore anticipated that when individual gases are passed into the chamber with heat activation, active species will be generated, which will then react with the surface oxides, etching away the coating on the substrate.

It will be appreciated by those skilled in the art that other variations to the preferred embodiment described herein may be practiced without departing from the scope of the invention, such scope being properly defined by reference to the specification and to the following claims.

The invention claimed is:
1. A method for cleaning reaction product deposits from interior surfaces of a chemical reactor chamber or from a substrate within said chemical reactor chamber, comprising the steps of:
   heating said reactor chamber to an elevated temperature of at least 100° C.;
   introducing an etchant gas into said reactor chamber, said etchant gas being of the general formula $AO_mX_n$, wherein:
   A is selected from the group consisting of C, N, and S;
   O is oxygen;
   X is a halogen; and
   the subscripts $m$ and $n$ are greater than zero;
   activating said etchant gas either before or after said introduction;
   allowing an etching reaction to proceed between said activated etchant gas and said reaction product deposits to remove said reaction product deposits without substantial re-deposition of etching reaction products within said reactor chamber; and
   evacuating said activated etchant gas together with substantially all products of said etching reaction;
   wherein pressure within said reactor chamber is between 20 mBar and 1000 mBar during said etching reaction.
2. The method of claim 1 comprising the further step of generating said etchant gas prior to said introduction into said chamber.
3. The method of claim 1 comprising the further step of bubbling a carrier gas through a liquid chemical constituent to volatilize said liquid chemical constituent into said etchant, prior to said introduction of said etchant gas into said chamber.

4. The method of claim 2 wherein said etchant gas is generated by bubbling a carrier gas through a plurality of liquid chemical constituents and then combining the resulting gases.

5. The method of claim 2 wherein said etchant gas is generated by mixing two or more chemical constituent gases.

6. The method of claim 1 wherein said etchant gas is activated by exposing it to an activation mechanism in a gas activation chamber prior to introduction into said reactor chamber; said gas activation mechanism being selected from the group consisting of heat, ultraviolet light and plasma discharge.

7. The method of claim 1 wherein said etchant gas is activated by exposing it to a thermal activation mechanism after introduction into said reactor chamber; said thermal activation mechanism being selected from the group consisting of: the overall temperature within said reactor chamber and a local heat source within the reactor chamber.

8. The method of claim 1 wherein said etchant gas further contains an additive of the general formula RX, wherein:

R is selected from the group consisting of H and Me; and

X is selected from the group consisting of F, Cl, Br and I.

9. The method of claim 1 wherein said etchant gas also contains a halogen gas additive.

10. The method of claim 1 wherein said pressure is between 500 mBar and 1000 mBar.

11. The method of claim 1 wherein said elevated temperature is between 100° C. and 400° C.

12. The method of claim 1 wherein said elevated temperature is between 250° C. and 400° C.

13. The method of claim 1 wherein said temperature is substantially constant during said etching reaction.

14. The method of claim 1 wherein said pressure is substantially constant during said etching reaction.

* * * * *